United States Patent
Zhong et al.

(10) Patent No.: US 9,653,358 B2
(45) Date of Patent: May 16, 2017

(54) SEMICONDUCTOR DEVICE STRUCTURE AND METHOD FOR MANUFACTURING THE SAME

(75) Inventors: Huicai Zhong, Beijing (CN); Qingqing Liang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 547 days.

(21) Appl. No.: 13/133,061

(22) PCT Filed: Feb. 25, 2011

(86) PCT No.: PCT/CN2011/000306
§ 371 (c)(1),
(2), (4) Date: Jun. 6, 2011

(87) PCT Pub. No.: WO2012/022109
PCT Pub. Date: Feb. 23, 2012

(65) Prior Publication Data
US 2012/0043593 A1    Feb. 23, 2012

(30) Foreign Application Priority Data

Aug. 19, 2010  (CN) .......................... 2010 1 0258369

(51) Int. Cl.
*H01L 21/8234* (2006.01)
*H01L 21/8238* (2006.01)
(Continued)

(52) U.S. Cl.
CPC ................ *H01L 21/823412* (2013.01); *H01L 21/823814* (2013.01); *H01L 21/823828* (2013.01);
(Continued)

(58) Field of Classification Search
CPC ..... H01L 21/78; H01L 23/3114; H01L 24/96; H01L 21/568; H01L 24/19; H01L 24/94;
(Continued)

(56) References Cited

U.S. PATENT DOCUMENTS 5,960,270 A     9/1999  Misra et al.
6,180,465 B1 *  1/2001  Gardner et al. ............... 438/291
(Continued)

FOREIGN PATENT DOCUMENTS

CN      101006569 A    7/2007
GB      1202162.2 A    8/2012
(Continued)

OTHER PUBLICATIONS

Quirk et al., Semiconductor Manufacturing Technology, Prentice-Hall, Upper Saddle River, NJ, pp. 450, © 2001.*
(Continued)

*Primary Examiner* — Stephen W Smoot
*Assistant Examiner* — Sun M King
(74) *Attorney, Agent, or Firm* — Troutman Sanders LLP

(57) ABSTRACT

The present invention presents a method for manufacturing a semiconductor device structure as well as the semiconductor device structure. Said method comprises: providing a semiconductor substrate; forming a first insulating layer on the semiconductor substrate; forming a shallow trench isolation embedded in the first insulating layer and the semiconductor substrate; forming a channel region embedded in the semiconductor substrate; and forming a gate stack stripe on the channel region. Said method further comprises, before forming the channel region, performing a source/drain implantation on the semiconductor substrate. By means of forming the source/drain regions in a self-aligned manner before forming the channel region and the gate stack, said method achieves the advantageous effects of the
(Continued)

replacement gate process without using a dummy gate, thereby simplifying the process and reducing the cost.

17 Claims, 11 Drawing Sheets

(51) Int. Cl.
    *H01L 27/02*     (2006.01)
    *H01L 29/10*     (2006.01)
    *H01L 29/66*     (2006.01)
    *H01L 29/78*     (2006.01)

(52) U.S. Cl.
    CPC .. *H01L 21/823878* (2013.01); *H01L 27/0207* (2013.01); *H01L 29/1054* (2013.01); *H01L 29/66545* (2013.01); *H01L 29/66651* (2013.01); *H01L 29/7848* (2013.01); *H01L 29/66553* (2013.01)

(58) Field of Classification Search
    CPC ............. H01L 27/0207; H01L 29/1054; H01L 21/823828; H01L 29/66651; H01L 29/7848; H01L 29/66545; H01L 21/823878; H01L 21/823814; H01L 29/66553; H01L 21/823807; H01L 29/6621; H01L 29/7833; H01L 29/1041
    USPC ... 257/E21.453, E21.618, E21.619, E21.426
    See application file for complete search history.

(56) References Cited

U.S. PATENT DOCUMENTS

| | | | | |
|---|---|---|---|---|
| 6,943,087 | B1* | 9/2005 | Xiang et al. | 438/311 |
| 7,208,384 | B2* | 4/2007 | Koh | 257/E21.426 |
| 7,323,748 | B2* | 1/2008 | Yamada et al. | 257/E21.618 |
| 2004/0108558 | A1 | 6/2004 | Kwak et al. | |
| 2005/0104055 | A1 | 5/2005 | Kwak et al. | |
| 2005/0285194 | A1* | 12/2005 | Lee et al. | 257/347 |
| 2006/0046399 | A1 | 3/2006 | Lindert et al. | |
| 2006/0267046 | A1 | 11/2006 | Numata | |
| 2008/0286698 | A1* | 11/2008 | Zhuang et al. | 430/323 |
| 2010/0159685 | A1* | 6/2010 | Chuang et al. | 438/587 |

FOREIGN PATENT DOCUMENTS

| | | |
|---|---|---|
| GB | 2488634 A | 9/2012 |
| JP | 2005209980 A | 8/2005 |
| WO | PCT/CN2011/000306 | 2/2011 |

OTHER PUBLICATIONS

Office Action for GB1202162.2 dated Jan. 30, 2014.
Great Britain Examination Report dated Jul. 2, 2014 (foreign equivalent).

* cited by examiner

SEMICONDUCTOR DEVICE STRUCTURE AND METHOD FOR MANUFACTURING THE SAME

BENEFIT CLAIMS

This application is a US National Stage of International Application No. PCT/CN2011/000306, filed Feb. 25, 2011, which claims the benefit of CN 201010258369.4, filed Aug. 19, 2010.

FIELD OF THE INVENTION

The present invention relates to the technical field of semiconductor device design and manufacture, in particular, to a CMOS device in which source/drain regions are formed in a self-alignment manner before the formation of gate and a method for manufacturing the same.

BACKGROUND OF THE INVENTION

With the development of the semiconductor technology, the requirements on the performance and feature size of CMOS (Complementary Metal Oxide Semiconductor) devices are increasingly high. For the process integration of 45 nanometers technology node and below, the replacement gate (gate last) process is applied widely. FIG. 1 is a schematic drawing showing a typical conventional gate last process, which includes forming a sacrificial gate 100 first, forming source/drain regions 200, a sidewall spacer 30, and a silicide layer 400 covering the source/drain regions, then removing the sacrificial gate 100 to form an opening 500 surrounded by the inner walls of the sidewall spacer 300, and finally forming a replacement gate stack in the opening. The advantage of such a process is that the replacement gate stack is formed after the formation of the source/drain regions, thereby avoiding the adverse influence on the dielectric and conductor in the gate stack during high temperature annealing and other source/drain manufacturing processes.

However, said process has the following problems: the replacement gate process is complicated and has a high cost; it is more and more difficult to integrate contact holes into a CMOSFET (Complementary Metal Oxide Semiconductor Field Effect Transistor); and it is becoming harder to realize the high-k dielectric/metal gate stack process in a CMOS device. Therefore, it is imperative to develop a new manufacturing process that has the advantages of the replacement gate process while overcoming its problems.

SUMMARY OF THE INVENTION

One object of the present invention is to solve at least one of the above technical problems, especially to achieve the effect of the replacement gate process without using the sacrificial gate, thereby avoiding many defects caused by the replacement gate process.

To achieve the above object, according to one aspect of the present invention, a method for manufacturing a semiconductor device structure is provided. The method comprises: providing a semiconductor substrate; forming a first insulating layer on the semiconductor substrate; forming a shallow trench isolation structure embedded in the first insulating layer and the semiconductor substrate; forming a channel region embedded in the semiconductor substrate; forming a gate stack stripe on the channel region. The method further comprises, before forming the channel region, performing a source/drain implantation on the semiconductor substrate.

Preferably, the first insulating layer comprises any one of or a combination of more than one of $Si_3N_4$, $SiO_2$, $SiOx:F$, $SiCOH$, $SiO_x$, $SiO_2:C$, $SiCON$, and $SiON_x$.

Optionally, if the source/drain implantation is performed before forming the first insulating layer, said method further comprises, after forming the shallow trench isolation, etching back the first insulating layer and forming a second insulating layer on the etched back first insulating layer, the material of the second insulating layer being the same as the material of the first insulating layer; and wherein forming the channel region further comprises etching the second insulating layer that is above the channel region.

Optionally, if the source/drain implantation is performed after forming the shallow trench isolation, said method further comprises, after forming the shallow trench isolation, removing a portion of the first insulating layer that covers active regions, performing the source/drain region implantation on the semiconductor substrate, and forming a second insulating layer on the semiconductor substrate, the material of the second insulating layer being the same as the material of the first insulating layer; and wherein forming the channel region comprises etching the second insulating layer that is above the channel region.

Preferably, forming the channel region comprises: forming a stripe-type trench embedded in the first insulating layer and the semiconductor substrate, the bottom of the trench being higher than the bottom of the shallow trench isolation; forming a third insulating layer at the bottom of the trench; and forming the channel region on the third insulating layer and in the trench.

Preferably, the third insulating layer comprises any one of or a combination of more than one of $Si_3N_4$, $SiO_2$, $SiOx:F$, $SiCOH$, $SiO_x$, $SiO_2:C$, $SiCON$, and $SiONx$.

Preferably, forming the channel region comprises epitaxially growing the channel region by using the exposed sidewalls of the trench as crystal growth seed.

Preferably, the material of the channel region includes any one of or a combination of more than one of Si, Si:C, GaN, AlGaN, InP, and SiGe. Thus the composition material of the channel region can be selected as desired.

Preferably, the method further comprises, after forming the channel region, forming an inner sidewall spacer for the gate, the inner sidewall spacer being above the channel region and on the sidewalls of the trench, so as to reduce the feature size of the channel at the gate, thereby reducing the difficulty in the short gate process.

Preferably, performing the source/drain implantation on the semiconductor substrate comprises performing the source/drain implantation on the entire semiconductor substrate or active regions on the semiconductor substrate, and performing an annealing to activate the implanted impurities.

Preferably, forming the gate stack stripe on the channel region comprises: forming a gate dielectric layer on the channel region; forming the gate electrode stripe on the gate dielectric layer; removing the first insulating layer; and forming an outer sidewall spacer surrounding the outside of the gate electrode stripe, wherein, after forming the outer sidewall spacer and before completing the front-end-of-line of the semiconductor device, the gate electrode stripe is cut to form electrically isolated gate electrodes.

Preferably, the gate electrode stripe are cut by using reactive ion etching or laser cutting.

Preferably, after forming the gate stack stripe, the gate electrode stripe are cut to form electrically isolated gate electrodes, and said method further comprises: forming an interlayer dielectric layer on the semiconductor substrate to fill in between the isolated gate electrodes; and etching the interlayer dielectric layer to form contact holes on the gate electrodes or the source/drain regions.

Preferably, after forming the gate stack stripes, said method further comprises: forming a first interlayer dielectric layer; etching the first interlayer dielectric layer to form lower contact holes on the source/drain regions; forming lower contacts in the lower contact holes; cutting the gate electrode stripe; forming a second interlayer dielectric layer; etching the second interlayer dielectric layer to form upper contact holes on the gate electrode stripe or the source/drain regions; forming upper contacts in the upper contact holes, wherein, on the source/drain regions, the lower contacts are aligned with the upper contacts. It can be seen that the embodiment of the present invention is also compatible with the dual-contact-hole process.

According to another aspect of the present invention, a semiconductor device structure manufactured according to the above-mentioned method is provided. The semiconductor device structure comprises: a semiconductor substrate; a channel region buried in the semiconductor substrate; a gate stack on the channel region, the gate stack including a gate dielectric layer on the channel region and a gate electrode on the gate dielectric layer; source/drain regions on respective sides of the channel region in the semiconductor substrate, wherein the source/drain regions are formed by performing a source/drain implantation on the semiconductor substrate before forming the channel region and the gate stack, thereby impurity concentration at the same depth in the source/drain regions is uniform.

Preferably, the material of the channel region includes any one of or a combination of more than one of Si, Si:C, GaN, AlGaN, InP, and SiGe.

Preferably, the channel region is formed by epitaxial growth.

Preferably, there is an insulating layer between the bottom of the channel region and the semiconductor substrate.

Preferably, a shallow trench isolation is formed in the semiconductor substrate, and the bottom of the insulating layer is higher than the bottom of the shallow trench isolation.

Preferably, the insulating layer comprises any one of or a combination of more than one of $Si_3N_4$, $SiO_2$, SiOx:F, SiCOH, $SiO_x$, $SiO_2$:C, SiCON, and SiONx.

Preferably, the semiconductor device structure further comprises an inner sidewall spacer for the gate, wherein the inner sidewall spacer is formed above the channel region and on lateral sides of the gate stack, and the end of said inner sidewall spacer is flush with the end of the gate electrode in the direction of gate width.

Preferably, the semiconductor device structure further comprises an outer sidewall spacer formed on lateral sides of the gate stack, wherein the end of said outer sidewall spacer is flush with the end of the gate electrode in the direction of gate width.

Preferably, in the direction of gate width, a dielectric material is filled in between adjacent gate electrodes to achieve electrically isolation between the gate stacks.

Preferably, in the semiconductor device structure, the distance between adjacent gate electrodes is 1-10 nm in the direction of gate width.

Preferably, the semiconductor device structure further comprises lower contacts and upper contacts, the lower contacts being in contact with the source/drain regions and being level with the top of the gate stack, and the upper contacts being in contact with the top of the gate stack and the lower contacts, respectively; wherein on the source/drain regions, the lower contacts are aligned with the upper contacts.

According to the present invention, it is provided a method for forming source/drain regions in a self-aligned manner by means of performing implantation on a semiconductor substrate before forming the channel region and the gate stack, which achieves the advantageous effects of the replacement gate process without using the sacrificial gate, thereby simplifying the process and reducing the cost. In addition, performing the source/drain implantation before forming the channel region can avoid the diffusion of impurities which is likely to be caused by forming the source/drain regions in the conventional process. Meanwhile, by adding an inner sidewall spacer of the gate, the feature size of the channel under the gate can be effectively adjusted. Furthermore, the performance of an MOSFET device is greatly enhanced by applying an epitaxial channel that effectively increases the carrier mobility. In addition, one embodiment of the present invention also incorporates a particular process of gate electrode stripe cutting, which can effectively improve the isolation between the gate electrodes, simplify etching and photolithography of the gate electrodes, and reduce the difficulty in OPC (Optical Proximity Correction). This process is also compatible with the high-k dielectric/metal gate process.

Additional aspects and advantages of the present invention will be given in the following descriptions, some of which will be apparent from the following descriptions or be learned from practices of the present invention.

BRIEF DESCRIPTION OF THE DRAWINGS

The above and/or additional aspects and advantages of the present invention will become apparent and easily understood from the following descriptions of the embodiments in conjunction with the drawings. The drawings of the present invention are schematic and not drawn to scale, in which:

FIGS. 2-16a are the sectional views of a semiconductor device structure in the intermediate steps of the method for manufacturing the semiconductor device structure according to the embodiments of the present invention.

Figure 1:
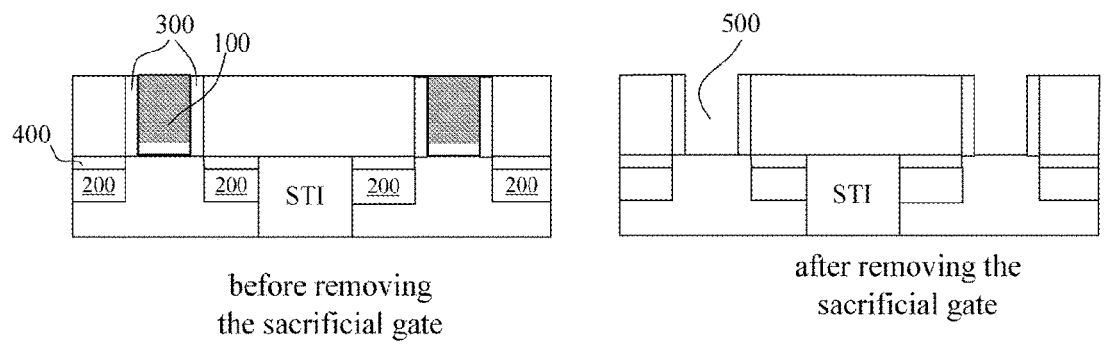
FIG. 1 is a schematic drawing showing the replacement gate process in the prior art.

In the drawings, a figure number having the suffix "a" means that the figure is a sectional view along the direction AA' in the plan view, a figure number having the suffix "b" means that the figure is a sectional view along the direction BB' in the plan view, and a figure number having the suffix "c" means that the figure is a sectional view along the direction CC' in the plan view.

DETAILED DESCRIPTION OF PREFERRED EMBODIMENTS

The embodiments of the present invention will be described in details below, and examples of said embodiments are shown in the figures. Throughout the drawings, the same or similar reference numbers represent the same or similar elements or elements having the same or similar functions. The embodiments described below with reference to the drawings are exemplary, which are only for illustrating the present invention instead of limiting the present invention.

The following disclosure provides a plurality of different embodiments or examples to achieve different structures of the present invention. To simplify the disclosure of the present invention, description of the components and arrangements of specific examples is given below. Of course, they are only illustrative and not intended to limit the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

FIGS. 2-16a are the sectional views of the structures of the semiconductor device in intermediate steps of manufacturing the semiconductor device according to embodiments of the present invention. The method for manufacturing the semiconductor device structure according to embodiments of the present invention as well as the device structure obtained thereby will be described in detail below with reference to FIGS. 2-16a.

Figure 2:
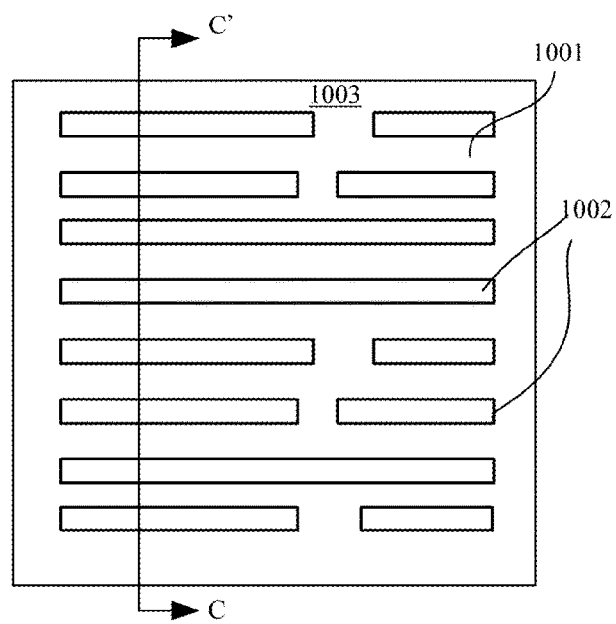
Figure 2C:
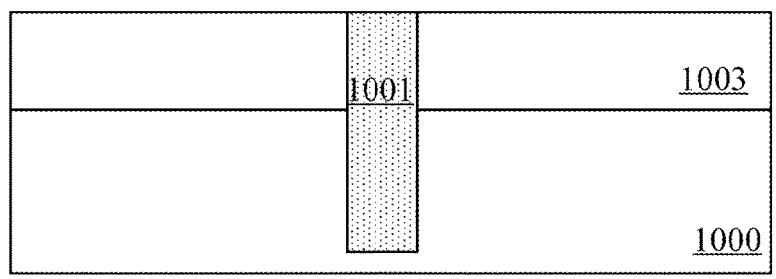

As shown in FIGS. 2 and 2c, a semiconductor substrate 1000 is provided. In this embodiment, the substrate 1000 is, for example, bulk silicon, but in practical applications, the substrate may comprise any suitable semiconductor substrate material, which may specifically be, but not limited to, silicon, germanium, silicon germanium, SOI (Silicon On Insulator), silicon carbide, gallium arsenide, or any group III/V compound semiconductor, or the like. According to known design specifications (for example, for a p-type substrate or an n-type substrate), the substrate 1000 may comprise various kinds of doping configurations. In addition, the substrate 1000 may optionally comprise an epitaxial layer such that it may be manipulated under stress, so as to enhance the performances.

According to a preferred embodiment of the present invention, a source/drain implantation is performed before forming a first insulating layer 1003. Specifically, an ion implantation is first performed on the entire semiconductor substrate 1000. For example, an n-type or p-type heavy doping and an annealing for activation are performed, so as to form doped regions with uniform ion concentration at the same depth in the entire semiconductor substrate. It shall be noted that the doped regions that still remain after the following subsequent processes will form source/drain regions. That is, the source/drain regions are formed in a self-aligned manner. Then the first insulating layer 1003 is formed on the surface of the semiconductor substrate 1000, which may comprise any one of or a combination of more than one of $Si_3N_4$, $SiO_2$, SiOx:F, SiCOH, $SiO_x$, $SiO_2$:C, SiCON, and SiONx. In one embodiment of the present invention, $Si_3N_4$ is preferably used. Next, the first insulating layer 1003 and the semiconductor substrate 1000 are etched to form trenches according to the desired shape of the shallow trench isolation (STI) 1001 to be formed, and the trenches are filled with an oxide, e.g. $SiO_2$, to form shallow trench isolation STI 1001 structures, as shown in FIGS. 2 and 2c. FIG. 2c is a sectional view taken along the direction of CC' in FIG. 1. For purposes of convenience, FIG. 2c only shows one STI structure 1001. After forming the STI, a planarization process will be performed, e.g. by means of CMP (Chemical Mechanical Polishing).

Optionally, before forming the first insulating layer 1003, an oxide layer may be formed on the semiconductor substrate 1000 by means of a conventional thermal oxidation or other deposition processes. For the sake of convenience, said oxide layer is not shown in the figures.

After forming the STI regions, the first insulating layer 1003 may be optionally etched back to a position lower than the top of the STI, and then a second insulating layer is deposited (not shown in the figures). The material of the second insulating layer may be the same as that of the first insulating layer. Forming the additional second insulating layer will facilitate the formation of a better surface.

According to another preferred embodiment of the present invention, the source/drain implantation is performed after forming the STI, as shown in FIGS. 2 and 2c. Then, the semiconductor substrate 1000 comprises an STI 1001 and active regions 1002 therein. Specifically, the first insulating layer 1003 is firstly formed on the surface of the semiconductor substrate 1000. The first insulating layer 1003 and the semiconductor substrate 1000 are etched according to the desired shape of the STI 1001 to form a trench. The trench is filled with an oxide, e.g. $SiO_2$, to form the STI 1001. Then a portion of the first insulating layer 1003 that covers the surface of the active regions 1002 is removed to expose the active regions. Next, ion implantation is performed on all of the active regions 1002 or the entire semiconductor substrate. For example, an n-type or p-type heavy doping and an annealing process for activation are performed, so as to form doped regions with uniform doping profile in all of the active regions. Likewise, the doped regions that still remain after the following subsequent processes will form source and drain regions. That is, the source and drain regions are formed in a self-aligned manner. Then a second insulating layer is formed on the semiconductor substrate 1000, which is of the same material as the first insulating layer. For the sake of convenience, the second insulating layer is still indicated by the first insulating layer 1003 in the subsequent figures.

Likewise, before forming the first insulating layer 1003, an oxide layer may be optionally formed on the semiconductor substrate 1000, which is not shown in the figures.

So far, according to the methods according to the above two embodiments, a substrate having an STI and source/drain regions formed therein can be obtained. The following subsequent steps are the same with respect to said two embodiments, so subsequent steps are described together. With the methods according to the embodiments of the present invention, the source/drain regions is formed and the annealing for activation is performed in advance, so the gate formed in the subsequent processes will not be subject to the high temperature annealing, which facilitates to maintain good characteristics of the gate.

Then, a photoresist layer is coated on the semiconductor structure having the STI 1001 formed therein, and then is patterned according to the shape of the gate electrode stripes to be formed, so that the regions where the gate electrode stripes are to be formed are exposed, while other regions are covered with the photoresist. The first insulating layer 1003 and the semiconductor substrate 1000 are selectively etched with the formed photoresist pattern as a mask. For example, in one embodiment of the present invention, the first insulating layer 1003 is $Si_3N_4$, and the STI is filled with $SiO_2$. In this case, $Si_3N_4$ and Si are etched selectively to $SiO_2$ in the etching process. Finally trench 1005 embedded in the first insulating layer 1003 and the semiconductor substrate 1000 is formed. The bottom of the trench 1005 is higher than the bottom of STI 1001, so that STI can function as device isolation.

Alternatively, if the second insulating layer is formed in the previously described steps, when forming the stripe trench 1005 by the etching process, the etching starts from the second insulating layer down.

Figure 3:
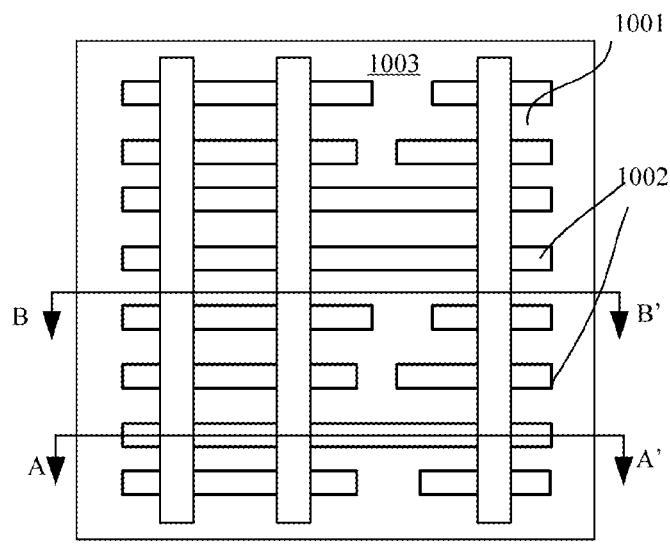
Figure 3A:
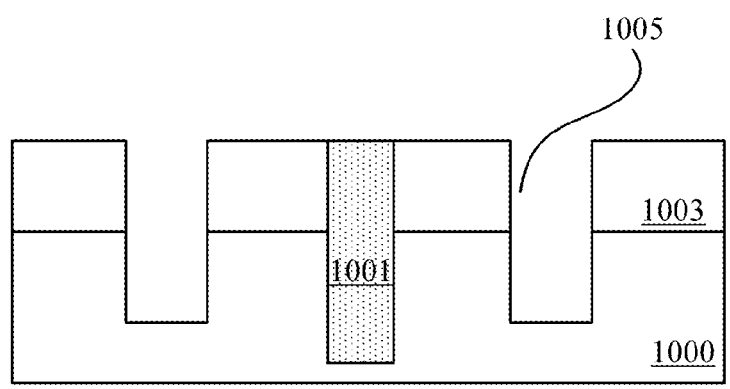
Figure 3B:
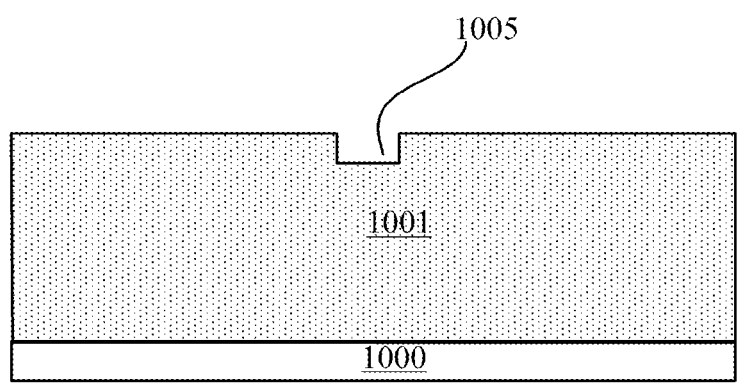

FIGS. 3a and 3b are the sectional views in the directions of BB' and CC' of FIG. 2, respectively, which clearly show the result of the selective etching. The size of the trench 1005 in FIG. 3a indicated by the arrow can be larger than the dimension of the finally obtained device channel under the gate. This can facilitate the photolithographic process, and the feature size of the channel under the gate can be further reduced by the later formed inner sidewall spacer. FIG. 3b shows that said etching has little impact on the STI and only a very shallow trench 1005 is formed.

For the sake of convenience, in the subsequent schematic drawings, the suffixes a and b in the figure numbers respectively represent sectional views along the directions of AA' and BB' unless otherwise specified.

Figure 4:
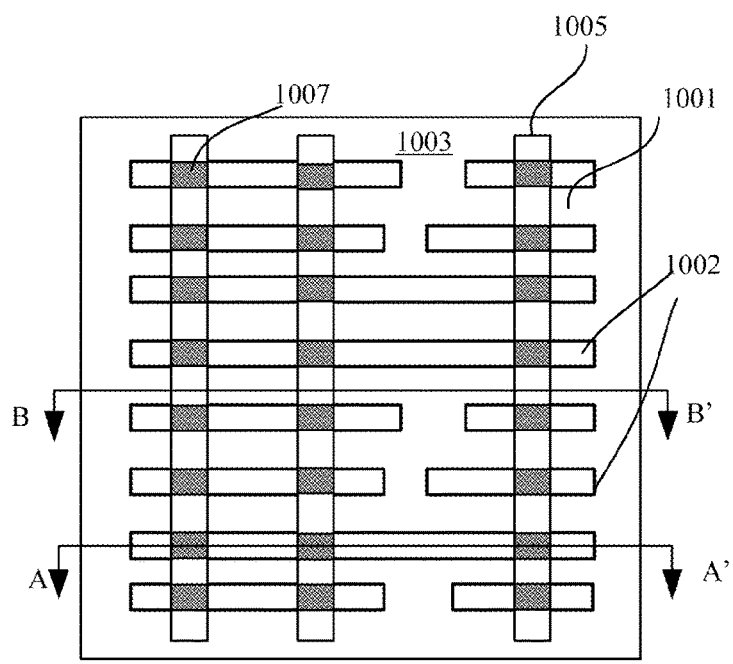
Figure 4A:
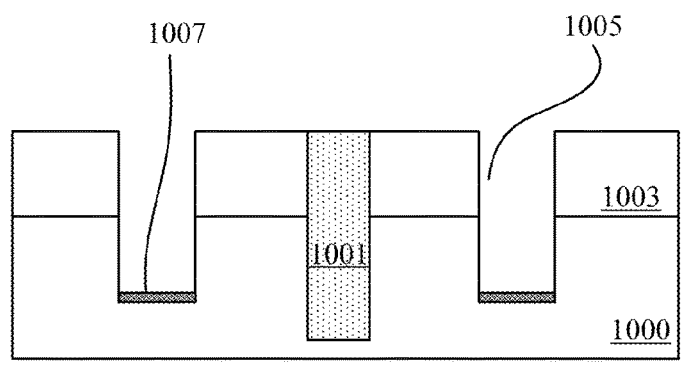
Figure 4B:
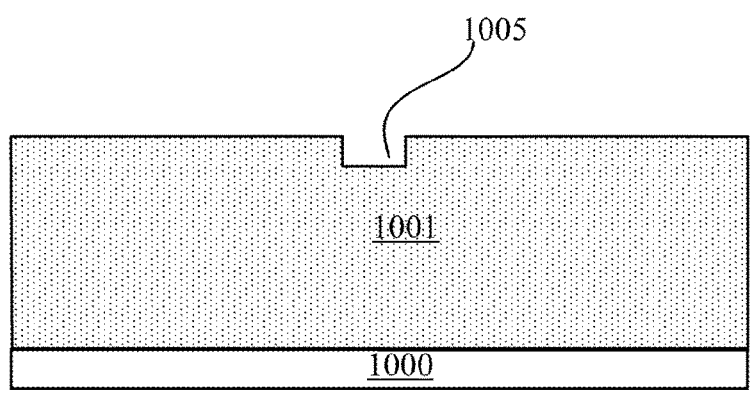

Optionally, as shown in FIGS. 4, 4a, and 4b, a third insulating layer 1007 is formed on the trench 1005, which may comprise any one of or a combination of more than one of $Si_3N_4$, $SiO_2$, SiOx:F, SiCOH, $SiO_x$, $SiO_2$:C, SiCON, and SiONx. The process for forming the third insulating layer 1007 may be, but not limited to, thermal oxidation, ALCVD (Atomic Layer Chemical Vapor Deposition), or other film deposition processes. The third insulating layer 1007 can adjust the dimension of the channel region to be formed later, and also improve the switching speed of the device. For example, when forming the third insulating layer in the trench, a structure may be formed in which a relatively thick insulating layer is formed at the bottom of the trench while a very thin or almost no insulating layer is formed on the sidewalls of the trench by using the selective ALCVD process. After forming the third insulating layer in the trench, a selective wet chemical etching or dry chemical etching may be performed to expose the sidewalls of the trench, leaving the insulating layer (with the thickness of 5-50 nm) at the bottom of the trench.

Figure 5:
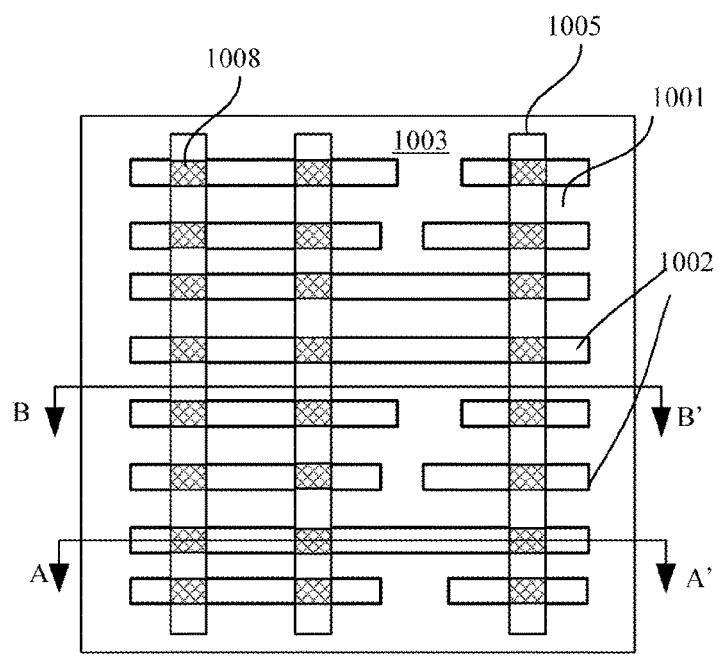
Figure 5A:
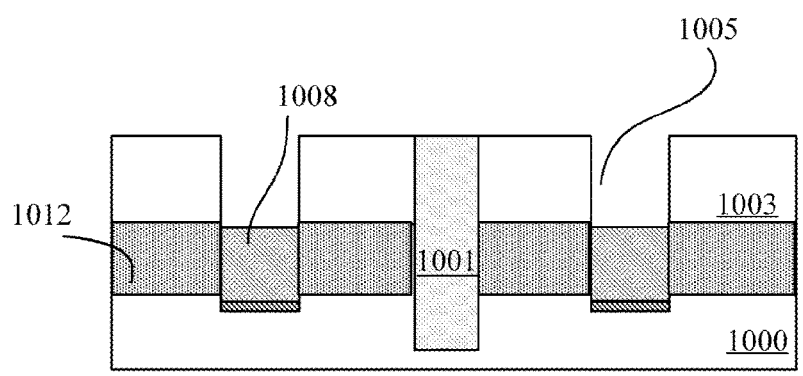
Figure 5B:
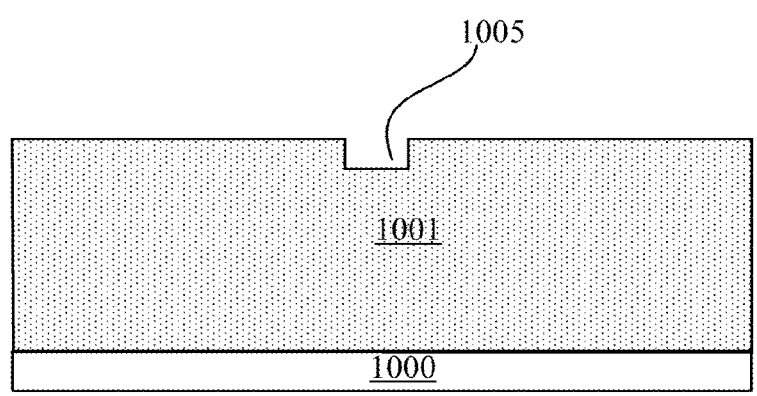
Figure 6A:
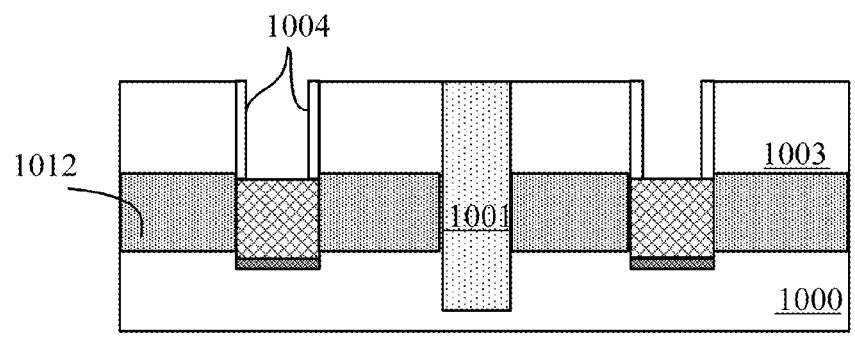
Figure 6B:
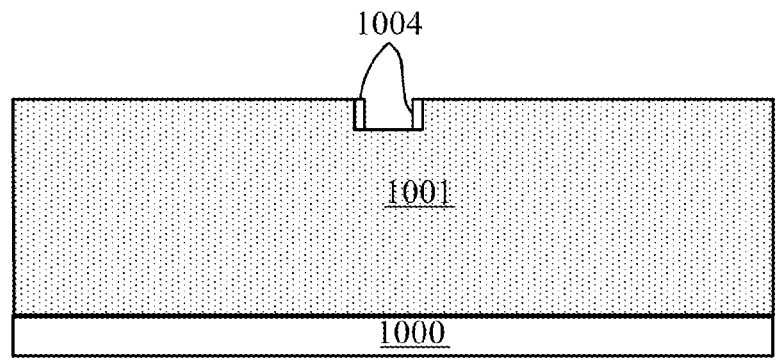

Then, as shown in FIGS. 5, 5a, and 5b, a channel region 1008 is grown epitaxially with the exposed sidewalls of the trench 1005 as the crystal growth seed. For example, any one of or a combination of more than one of Si, SiC, GaN, AlGaN, InP, and SiGe may be grown epitaxially, so as to form the channel region 1008. Meanwhile, the stress in the channel region may be adjusted by adjusting the content of a certain impurity in the compound or composition, for example, by selecting a percentage of Ge in SiGe or a percentage of C in Si:C as required. The thickness of the channel region formed in this way is adjustable, the concentration of the impurities in the channel region can be selected, and a stress can be generated in the channel. Thus, the carrier mobility and device performances can be effectively improved.

So far, the doped regions (i.e. the active regions 1002) in the semiconductor substrate 1000, except for the channel regions 1008, formed source/drain regions 1012 in a self-aligned manner, which are located on opposite sides of the channel region, as shown in FIG. 5a.

Optionally, after forming the channel region, an inner sidewall spacer 1004 is formed on the inner sidewalls of the trench 1005 above the channel region 1008. Specifically, an ALD (Atomic Layer Deposition) process is performed above the channel region 1008 to form a filling layer, and the filling layer is selectively etched to form an inner sidewall spacer 1004 for the gate stack. The width of the inner sidewall spacer 1004 of the gate is 1-5 nm, and its shape is not limited to those shown as examples in FIGS. 6a and 6b in the present invention. The material of the filling layer can be oxide or nitride, such as silicon oxide ($SiO_2$) or silicon nitride ($Si_3N_4$), or a low-k material, such as SiOx:F, SiCOH, SiOx, $SiO_2$:C, SiCON, etc. By forming the inner sidewall spacer for the gate, the gate length can be further reduced, thereby reducing the difficulty in short gate length formation processes. For example, in the case that the dimension of the channel region is 30 nm and the width of the inner sidewall spacer 1004 for the gate is 5 nm, a gate length of 20 nm can be achieved for an originally lithography patterned 30 nm gate, and thus the difficulty in short gate length formation processes is reduced.

Next, gate stack stripes may be formed by conventional methods or methods provided in embodiments of the present invention. It shall be noted that, since the source/drain regions have been formed and subjected to a high temperature annealing before forming the channel regions, the gate stacks can be directly formed rather than using a replacement gate process for the purpose of thermal budge. Thereby, the process is simplified and the cost is reduced.

Figure 7:
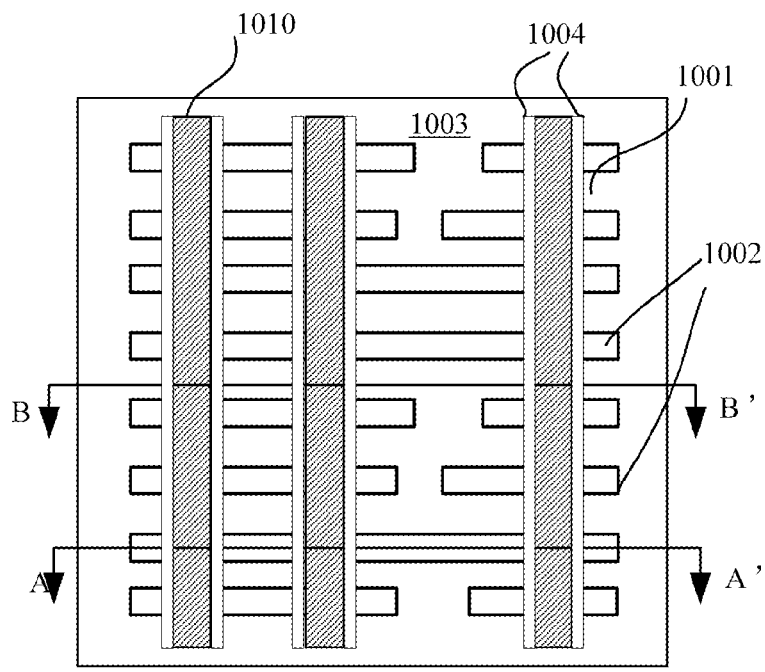
Figure 7A:
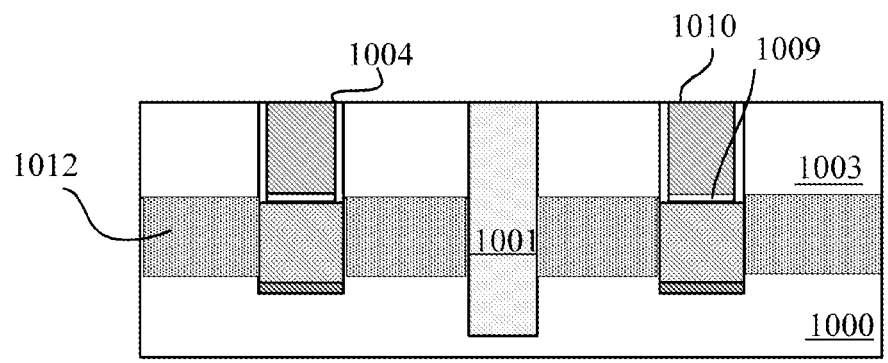
Figure 7B:
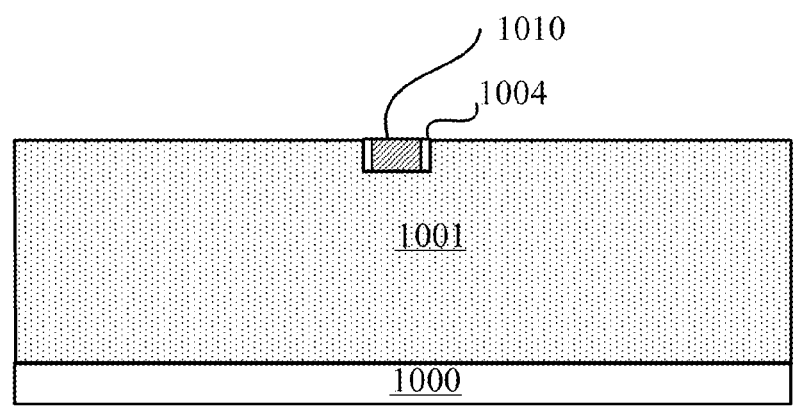

As shown in FIGS. 7, 7a, and 7b, a gate dielectric layer 1009 is formed on the channel region. The gate dielectric layer 1009 may be of a conventional dielectric material, or of a high-k dielectric material, e.g. any one of or a combination of more than one of $HfO_2$, HfSiO, HfSiONx, HfTaO, HfTiO, HfZrO, $Al_2O_3$, $La_2O_3$, $ZrO_2$, and LaAlO. The dielectric layer may be formed by such processes as thermal oxidation, sputtering, deposition, or the like. The high-k gate dielectric layer can suppress the short channel effects of the device. Afterwards, gate electrode stripes 1010 are formed on the gate dielectric layer 1009. Specifically, a layer of conductive material, e.g. Poly-Si, Ti, Co, Ni, Al, W, metal alloy, or the like, may be deposited on the entire semiconductor device structure. Then, a CMP (Chemical Mechanical Polishing) process is performed on the entire semiconductor device structure with the first insulating layer 1003 as a stopper.

FIG. 7b shows that the gate electrode stripe 1010 on the STI 1001 is very thin.

Figure 8A:
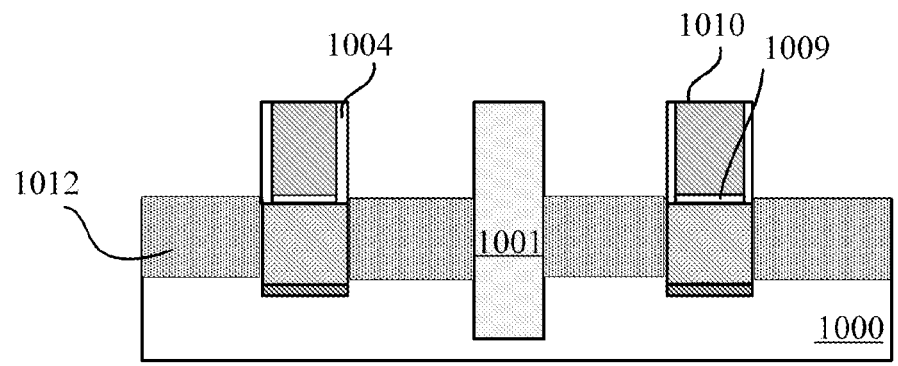
Figure 8B:
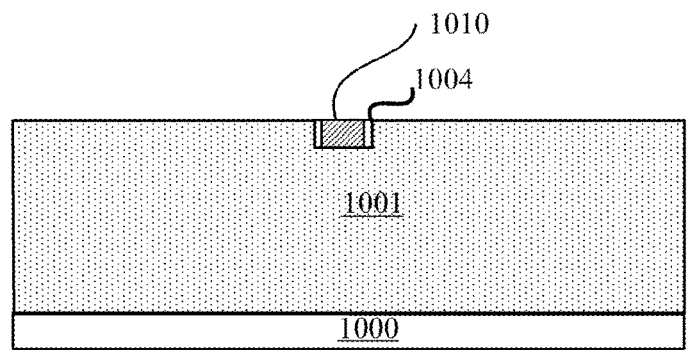

Next, the first insulating layer 1003 is removed by such processes as wet etching, dry etching, or the like, so as to form the structure as shown in FIGS. 8a and 8b. For example, hot phosphoric acid can be used to etch $Si_3N_4$.

Then, a portion of the STI 1001 that is higher than the substrate 1000 in FIG. 8a may be optionally removed, for example, by etching using HF.

Figure 9:
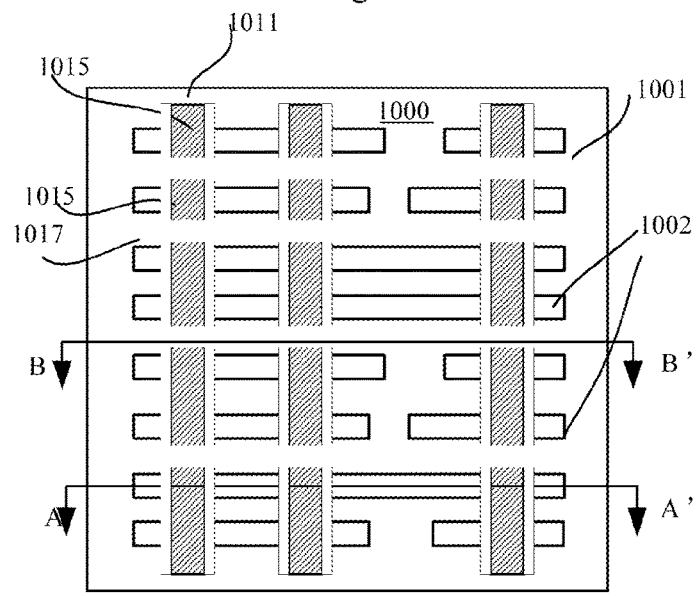

In conventional processes, the embodiment of the present invention can use the photolithographic mask once again to cut the gate electrode stripes into gate electrodes. As shown in FIG. 9, the gate electrode stripes 1010 are cut by a conventional process, so as to form electrically isolated gate electrodes 1015. FIG. 9 schematically shows notches 1017 etched out by using a mask, and the formation of the notches may completely depend on the requirement of the device.

Figure 10:
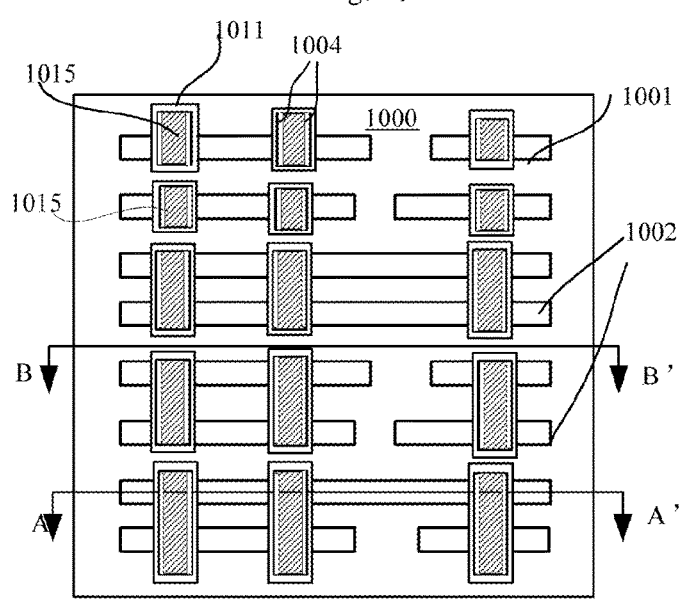
Figure 10A:
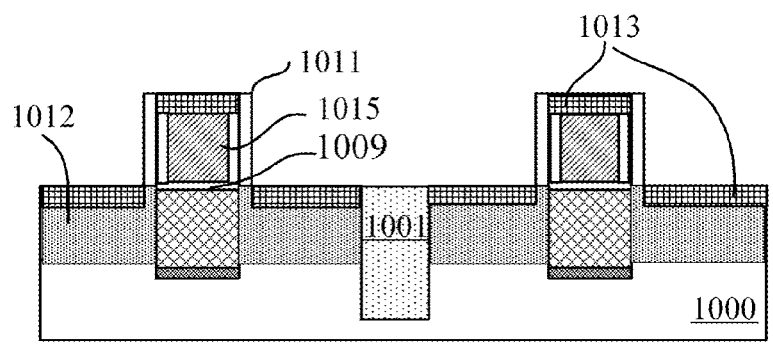

Next, an outer sidewall spacer 1011 is formed on the outside of the gate electrode 1015. Embodiments of the present invention do not limit the shape or material of the formed sidewall spacers, and the shapes of the sidewall spacers as shown in FIGS. 10 and 10a are only examples. If the inner sidewall spacer for the gate, which is optional, is formed, the outer sidewall spacer 1011 will be formed surrounding the inner sidewall spacer 1004 of the gate.

Figure 10B:
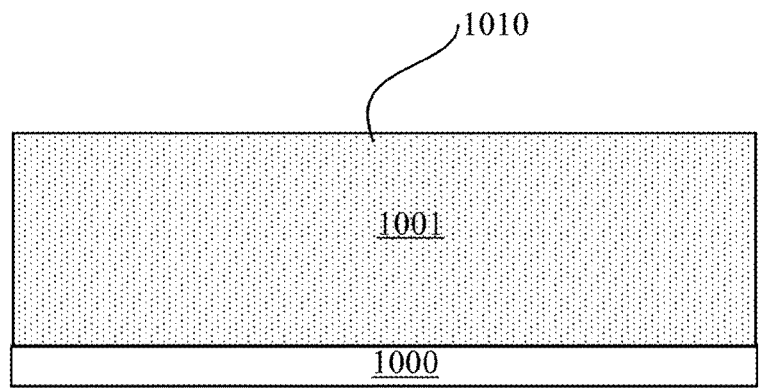

A metal silicide contact may be formed on the source/drain regions 1012 and the gate electrode 1015 as desired. First, a layer of metal, e.g. Ni, Co, W, etc., is deposited on the entire semiconductor device structure, and then a rapid thermal annealing is performed to form a metal silicide contact and the unreacted metal is removed. Finally, the metal silicide 1013 as shown in FIG. 10*a* is formed. While removing the unreacted metal, the very thin gate electrode stripes 1010 on the STI might also be removed, as shown in FIG. 10*b*.

So far, the semiconductor device structure according to one embodiment of the present invention is formed. As shown in FIGS. 10, 10*a*, and 10*b*, said semiconductor device structure comprises: a semiconductor substrate 1000; a channel region 1008 buried in the semiconductor substrate 1000; a gate stack formed on the channel region 1008, the gate stack comprising a gate dielectric layer 1009 on the channel region and a gate electrode 1015 on the gate dielectric layer; and source/drain regions 1012 on opposite sides of the channel region 1008, the source/drain regions 1012 having an uniform doping profile.

Preferably, the material of the channel region includes any one of or a combination of more than one of Si, Si:C, GaN, AlGaN, InP, and SiGe.

Moreover, there is an insulating layer 1007 between the bottom of the channel region 1008 and the semiconductor substrate 1000. Said insulating layer 1007 may includes any one of or a combination of more than one of $Si_3N_4$, $SiO_2$, SiOx:F, SiCOH, SiOx, $SiO_2$:C, SiCON, and SiONx, and its thickness may be 5-50 nm.

The lower surface of the insulating layer 1007 is higher than the bottom of the STI 1001 as shown in the figures, so as to achieve a better isolation.

The method for manufacturing a semiconductor device structure according to another embodiment of the present invention is described below. After the structure shown in FIGS. 8, 8*a*, and 8*b* is formed, steps detailed hereinafter are performed instead of directly cutting the gate electrode stripes.

Figure 11:
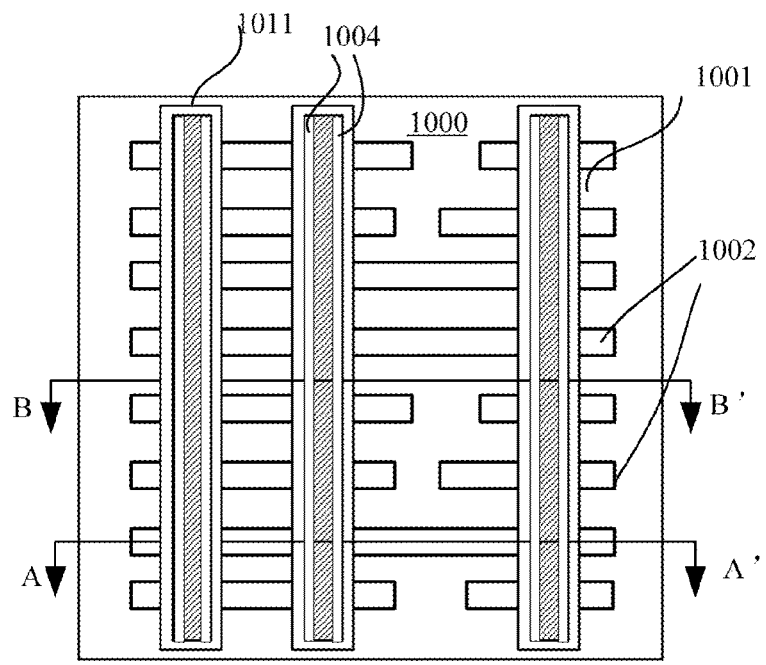
Figure 11A:
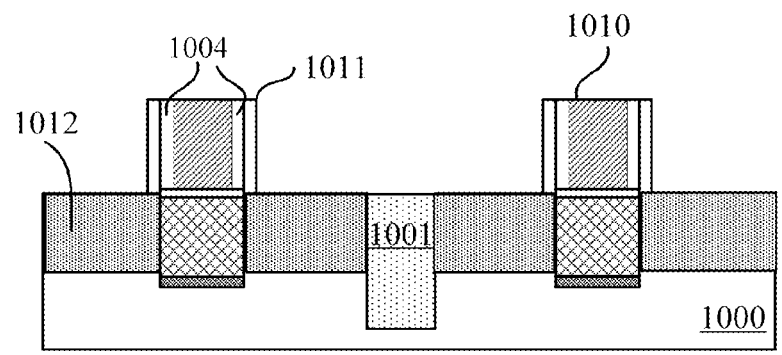
Figure 11B:
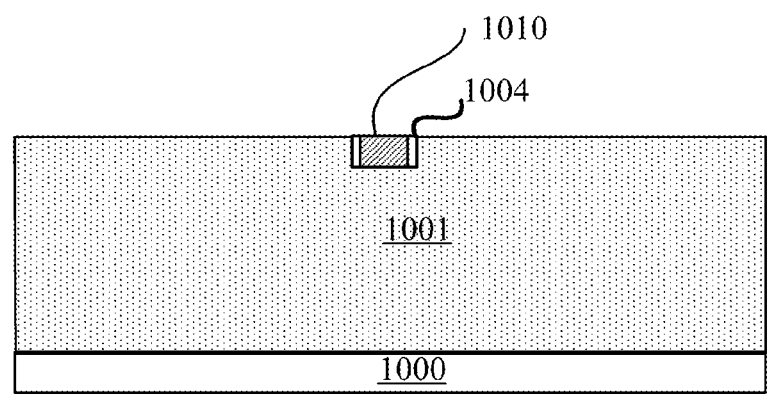

As shown in FIGS. 11, 11*a*, and 11*b*, an outer sidewall spacer 1011 is formed surrounding the gate electrode stripes 1010 or the inner sidewall spacer 1004 for the gate (the latter is shown in the figures). One specific process for forming the sidewall spacer 1011 has been described in the above embodiment and is thus omitted here. Therefore, the shape of the outer sidewall spacer as shown in FIGS. 11, 11*a* and 11*b* are merely examples.

Figure 12A:
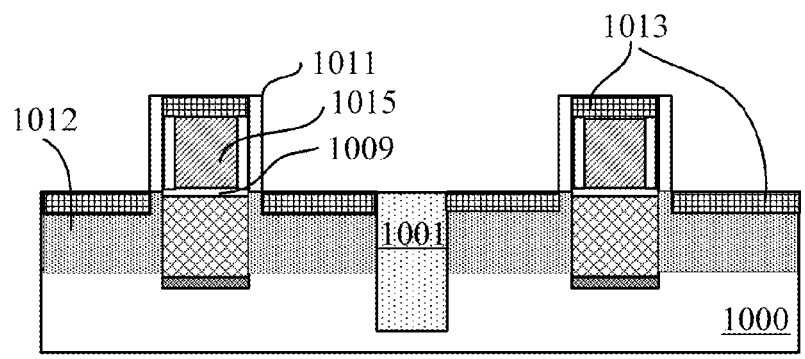

Then, metal silicide contacts are formed on the source/drain regions 1012 and the gate electrode stripes 1010. One process for forming the metal silicide has been described in the above embodiment and is thus omitted here. As a result, a structure as shown in FIG. 12*a* is formed.

Figure 13:
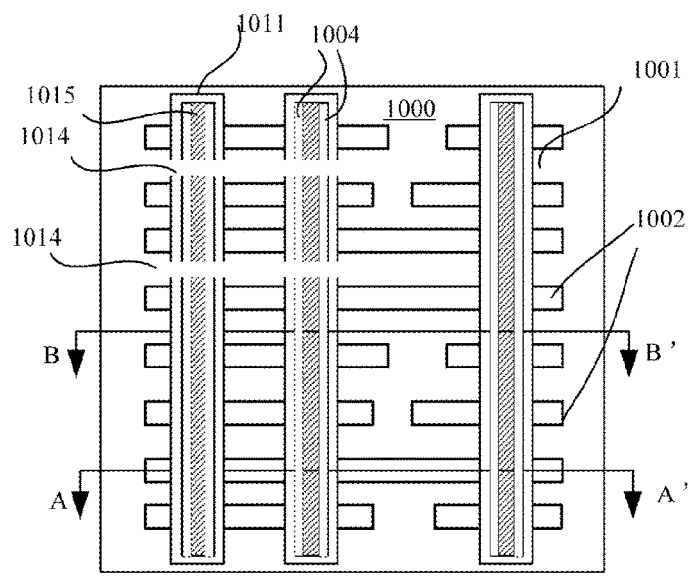

The gate electrode stripes 1010 may be cut at this stage. As shown in FIG. 13, the gate electrode stripes 1010 and/or the outer sidewall spacer 1011 are cut above the STI 1001 using laser cutting etching or RIE (reactive ion etching), thereby notches 1014 and gate electrodes 1015 that are electrically isolated from each other are formed. Optionally, the gate electrode stripes 1010 above the STI shown in FIG. 10*b* may also be cut off at the same time. For the sake of convenience, only two notches are shown in the figures, but the cutting can be performed as desired according to the present invention.

In conventional processes, the gate electrode stripes are cut right after forming the gate electrode stripes. In this case, in subsequent processes, for example, in the process of forming the outer sidewall spacer, the notches are very small and it is hard to fill the insulating material of the outer sidewall spacer thereinto. Thus, it is very likely that a short will occur between adjacent gate electrodes in subsequent processes. For example, during the formation of the metal silicide, a short between the gate electrodes would likely to occur. In the present invention, the gate electrode stripes are cut after forming the metal silicide, and the insulating dielectric is filled in subsequent processes, thereby effectively preventing a short between adjacent gate electrodes. Even if the notches are cut to be very small, the requirement of electrical isolation between gate electrodes can still be met. Such a method according to the present invention does not need a high precision mask or optical proximity correction (OPC), and thus the manufacture processes are simplified.

Figure 14:
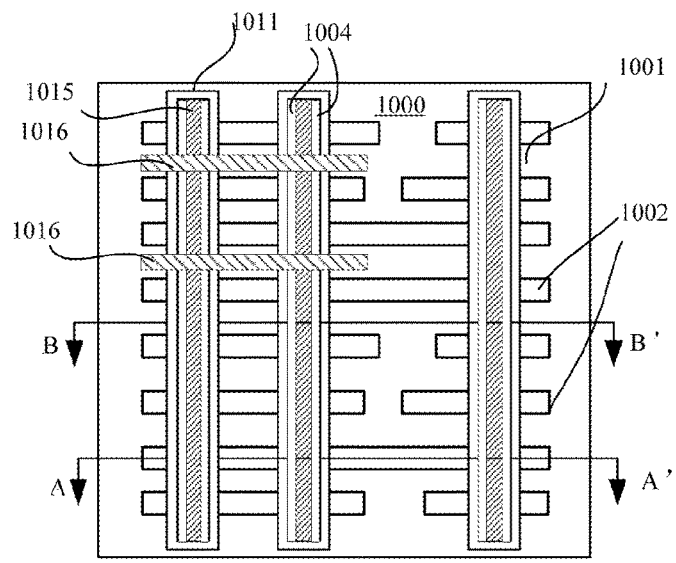
Figure 14A:
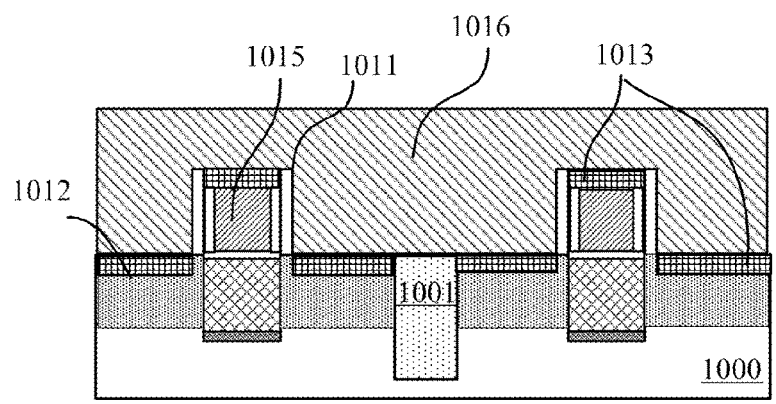
Figure 14B:
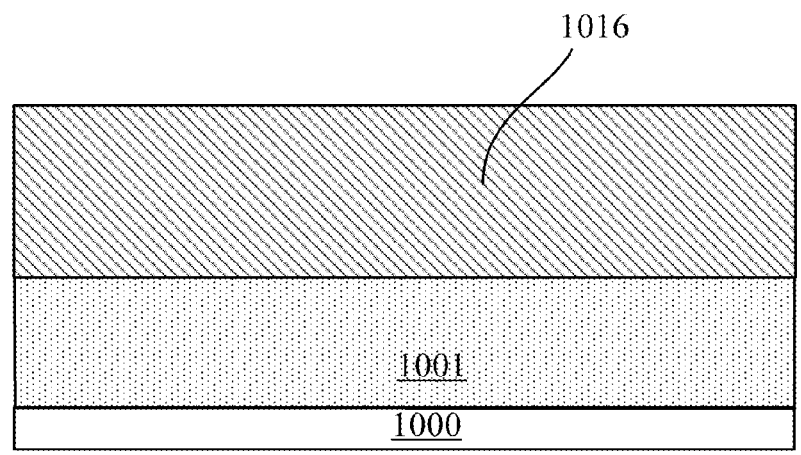

Next, an interlayer dielectric layer may be deposited. As shown in FIGS. 14, 14*a*, and 14*b*, after depositing the interlayer dielectric layer, the notches 1014 are filled up with a dielectric material 1016, which further ensures the electrical isolation between the gate electrodes 1015.

Then, contact holes and contacts may be formed using conventional processes to finish the device structure, which will not be detailed herein.

So far, a semiconductor device structure according to another embodiment of the present invention is formed. As shown in FIGS. 14, 14*a*, and 14*b*, said semiconductor device structure comprises: a semiconductor substrate 1000; a channel region 1008 buried in the semiconductor substrate 1000; a gate stack formed on the channel region 1008, the gate stack comprising a gate dielectric layer 1009 and a gate electrode 1015; source/drain regions 1012 on respective sides of the channel region 1008, the source/drain regions 1012 having an uniform doping profile.

Preferably, the material of the channel region 1008 comprises any one of or a combination of more than one of Si, Si:C, GaN, AlGaN, InP, and SiGe. Besides, there is an insulating layer 1007 between the bottom of the channel region 1008 and the semiconductor substrate 1000. The insulating layer 1007 may comprise any one of or a combination of more than one of $Si_3N_4$, $SiO_2$, SiOx:F, SiCOH, $SiO_x$, $SiO_2$:C, SiCON, and SiONx. The lower surface of the insulating layer 1007 is higher than the bottom of the STI 1001 as shown in the figures, so as to achieve a good isolation.

In addition, said semiconductor device structure comprises an inner sidewall spacer 1004 for the gate, which is formed only on lateral sides of the gate electrodes 1015; and an outer sidewall spacer 1011 formed outside of the inner sidewall spacer 1004 for the gate. In the direction of the gate width, the ends of the inner sidewall spacer 1004 and the outer sidewall spacer 1011 for the gate are flush with the end of the gate electrode 1015.

Preferably, a dielectric material 1016 is filled in between adjacent gate electrodes in the direction of the gate width to form electrical isolation between the gate electrodes. The distance between adjacent gate electrodes is preferably 1-10 nm.

In the semiconductor device structure according to this embodiment of the present invention, in the direction parallel to the gate width, the notches between the gate electrodes are parallel, and the dielectric material is filled in between the notches, so as to effectively isolate the gate electrodes from each other. Thereby, better device performances can be realized.

The process for gate electrode stripe cutting adopted in this embodiment of the present invention can greatly reduce the proximity effect that makes the photolithography, etching, and OPC complicated, and can make it easier to etch the gate electrode and to control the width of the gate electrode. Thus, the processes according to the embodiment of the present invention can simplify the semiconductor process design standard and further reduce the chip size.

The embodiment of the present invention is also favorable to high-k metal gate processes for 45 nm and below. The process for gate electrode stripe cutting in the embodiment of the present invention can also be effectively applied to the patterning of active regions.

FIGS. 15a-16a are the sectional views of device structures corresponding to the steps of the method of manufacturing a semiconductor device structure according to still another embodiment of the present invention. After forming the structure as shown in FIG. 7, the contact holes are formed by forming lower contact holes and upper contact holes, respectively, and the gate electrode stripes are cut after forming the lower contact holes. The specific steps of manufacturing the semiconductor device structure according to this embodiment of the present invention will be described in detail hereinafter with reference to FIGS. 15a-16a.

Figure 15A:
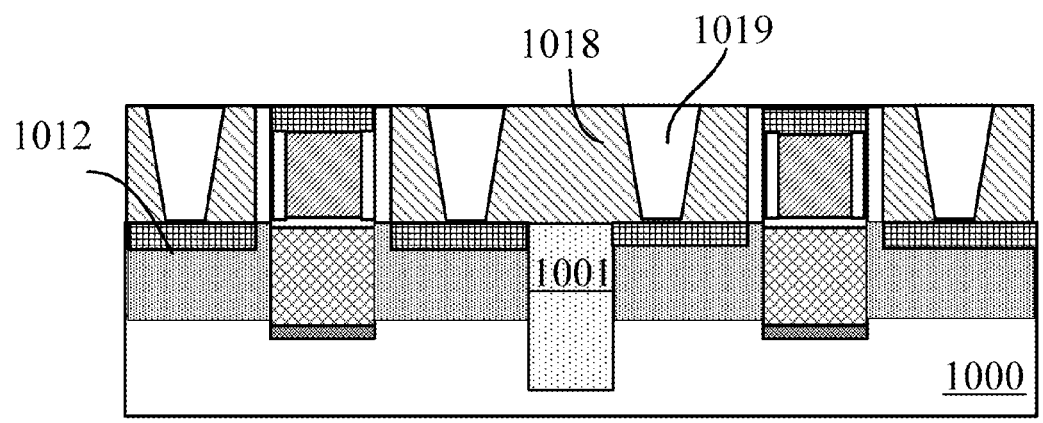

As shown in FIG. 15a, an interlayer dielectric layer 1018 is deposited on the entire semiconductor device structure. Optionally, the interlayer dielectric layer 1018 can be polished by, for example, CMP, until the top of the gate electrode stripes 1010 is exposed. Then, lower contact holes are formed in the interlayer dielectric layer 1018, which is filled with a conductive material, e.g. a metal such as W, so as to form the lower contacts 1019. Afterwards, the entire semiconductor device structure is polished until the top of the gate electrode stripes 1010 is exposed, thereby forming the lower contacts 1019 that are of the same height as the gate conductor layer.

Then, the gate electrode stripes 1010 may be cut as shown in FIG. 13 to form gate electrodes 1015 and parallel notches 1014 electrically isolating the gate electrodes 1015.

Figure 16A:
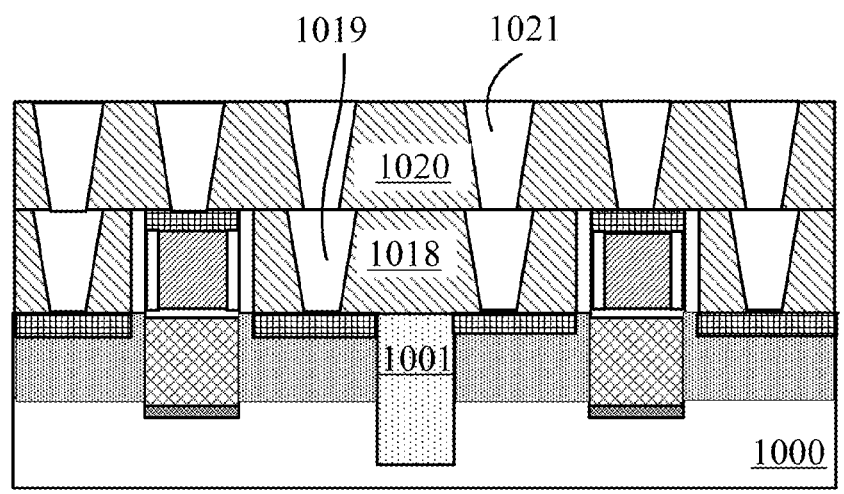

As shown in FIG. 16a, an interlayer dielectric layer 1020 is deposited on the entire semiconductor device structure. So, at this time, the dielectric material of the interlayer dielectric layer can fill up the parallel notches 1014. Afterwards, the interlayer dielectric layer 1020 is etched, so as to form upper contacts on the gate electrode 1015 and the lower contact holes 1019. Likewise, a conductive material, e.g. a metal such as W, is filled into the upper contact holes. Then, the entire semiconductor device structure is polished to form the upper contacts 1021 on the gate stack and/or the source/drain regions 1012. On the source/drain regions 1012, the lower contacts 1019 are aligned with the upper contacts 1021.

It can be seen that embodiments of the present invention are compatible with the dual contact hole formation process. The dual contact hole formation process can effectively prevent shorts between the gate electrodes, thereby improving the quality and performance of the semiconductor device.

FIG. 16a is a sectional view of a semiconductor device structure obtained according to yet another embodiment of the present invention. In addition to the structure shown in FIGS. 12, 12a, and 12b, the structure of this embodiment further comprises lower contacts 1019 and upper contacts 1021. The top of the lower contacts 1019 is of the same height as the top of the gate stacks, so the upper contacts 1021 on the gate stacks and the source/drain regions are also of the same height. Such a device structure can reduce the difficulty in the contact hole formation process.

Although the embodiments of the present invention have been shown and described above, it is readily apparent to those having ordinary skills in the art that the scope to which the present invention is applied is not limited to the process, mechanism, manufacture, material composition, means, methods, or steps described in the specific embodiments in the specification. A person of ordinary skills in the art would readily appreciate from the disclosure of the present invention that the process, mechanism, manufacture, material composition, means, methods, or steps currently existing or to be developed in future, which perform substantially the same functions or achieve substantially the same effects as those in corresponding embodiments described in the present invention, may be applied according to the present invention. Therefore, it is intended that the scope of the appended claims of the present invention includes these process, mechanism, manufacture, material composition, means, methods, or steps.

What is claimed is:

1. A method for manufacturing a semiconductor device structure, comprising:
   providing a semiconductor substrate;
   forming a first insulating layer on the semiconductor substrate;
   forming a shallow trench isolation structure embedded in the first insulating layer and the semiconductor substrate;
   forming a stripe trench embedded in the first insulating layer and the semiconductor substrate;
   forming a channel region in the stripe trench, wherein forming the channel region comprises:
      forming a third insulating layer at the bottom of the trench; and
      forming the channel region on the third insulating layer and in the trench, wherein the bottom of the trench being higher than the bottom of the shallow trench isolation;
   forming a gate stack stripe on the channel region in the stripe trench;
   wherein the method further comprises, before forming the channel region, performing a source/drain implantation on the semiconductor substrate to form a source region and a drain region,
   wherein after forming the channel region, the method further comprises forming an inner sidewall spacer for the gate above the channel region on inner sidewalls of the stripe trench, and the end of said inner sidewall spacer is flush with the end of the gate stack stripe in the direction of gate width; and
   wherein forming the gate stack stripe on the channel region comprises:
   forming a gate dielectric layer on the channel region;
   forming the gate stack stripe on the gate dielectric layer;
   removing the first insulating layer; and
   forming an outer sidewall spacer surrounding the inner sidewall spacer outside of the gate stack stripe; and
   cutting the gate stack stripe to form electrically isolated gate stacks;
   wherein at least a portion of a boundary of the channel region overlaps with at least a portion of a boundary of the source region and the drain region in a thickness direction of the semiconductor device structure, and
   wherein a bottom of the channel region is lower than a bottom of the source region and the drain region.

2. The method according to claim 1, wherein the first insulating layer comprises any one of or a combination of more than one of $Si_3N_4$, $SiO_2$, SiOx:F, SiCOH, $SiO_x$, $SiO_2$:C, SiCON, and $SiON_x$.

3. The method according to claim 1, wherein the third insulating layer comprises any one of or a combination of more than one of $Si_3N_4$, $SiO_2$, SiOx:F, SiCOH, $SiO_x$, $SiO_2$:C, SiCON, and SiONx.

4. The method according to claim 1, wherein forming the channel region comprises epitaxially growing the channel region by using the exposed sidewalls of the trench as crystal growth seed.

5. The method according to claim 1, wherein the material of the channel region includes any one of or a combination of more than one of Si, Si:C, GaN, AlGaN, InP, and SiGe.

6. The method according to claim 1, wherein performing the source/drain implantation on the semiconductor substrate comprises:
  performing the source/drain implantation on the entire semiconductor substrate or active regions on the semiconductor substrate, and performing an annealing to activate the implanted impurities.

7. The method according to claim 1, wherein the gate stack stripe are cut by using reactive ion etching or laser cutting.

8. The method according to claim 1, wherein, after forming the gate stack stripe, the gate stack stripe are cut to form electrically isolated gate stack, and
  said method further comprises:
    forming an interlayer dielectric layer on the semiconductor substrate to fill in between the isolated gate stack; and
    etching the interlayer dielectric layer to form contact holes on the gate stack or the source/drain regions.

9. The method according to claim 1, wherein, after forming the gate stack stripes and before cutting the gate stack stripe, said method further comprises:
  forming a first interlayer dielectric layer;
  etching the first interlayer dielectric layer to form lower contact holes on the source/drain regions;
  forming lower contacts in the lower contact holes; and
  wherein, after cutting the gate stack stripe, said method further comprises:
  forming a second interlayer dielectric layer;
  etching the second interlayer dielectric layer to form upper contact holes on the gate stack stripe or the source/drain regions;
  forming upper contacts in the upper contact holes,
  wherein, on the source/drain regions, the lower contacts are aligned with the upper contacts.

10. A semiconductor device structure, comprising:
  a semiconductor substrate;
  a channel region buried in the semiconductor substrate;
  a gate stack on the channel region, the gate stack including a gate dielectric layer on the channel region and a gate electrode on the gate dielectric layer;
  source/drain regions on respective sides of the channel region in the semiconductor substrate, wherein the source/drain regions are formed by performing a source/drain implantation on the semiconductor substrate before forming the channel region and the gate stack, thereby impurity concentration at the same depth in the source/drain regions is uniform, wherein at least a portion of a boundary of the channel region overlaps with at least a portion of a boundary of the source region and the drain region in a thickness direction of the semiconductor device structure;
  an inner sidewall spacer for the gate stack, wherein the inner sidewall spacer is formed above the channel region and on outer sidewalls of the gate stack, and the end of said inner sidewall spacer is flush with the end of the gate stack in the direction of gate width; and
  an outer sidewall spacer surrounding the inner sidewall spacer;
  wherein there is an insulating layer between the bottom of the channel region and the semiconductor substrate, and
  wherein the bottom of the channel region is lower than a bottom of the source region and the drain region.

11. The semiconductor device structure according to claim 10, wherein the material of the channel region includes any one of or a combination of more than one of Si, Si:C, GaN, AlGaN, InP, and SiGe.

12. The semiconductor device structure according to claim 10, wherein the channel region is formed by epitaxial growth.

13. The semiconductor device structure according to claim 10, wherein a shallow trench isolation is formed in the semiconductor substrate, and the bottom of the insulating layer is higher than the bottom of the shallow trench isolation.

14. The semiconductor device structure according to claim 10, wherein the insulating layer comprises any one of or a combination of more than one of $Si_3N_4$, $SiO_2$, SiOx:F, SiCOH, $SiO_x$, $SiO_2$:C, SiCON, and SiONx.

15. The semiconductor device structure according to claim 10, wherein, in the direction of gate width, a dielectric material is filled in between adjacent gate stacks to achieve electrically isolation between the gate stacks.

16. The semiconductor device structure according to claim 10, wherein the distance between adjacent gate stacks is 1-10 nm in the direction of gate width.

17. The semiconductor device structure according to claim 10, further comprising lower contacts and upper contacts, the lower contacts being in contact with the source/drain regions and being level with the top of the gate stack, and the upper contacts being in contact with the top of the gate stack and the lower contacts, respectively; wherein on the source/drain regions, the lower contacts are aligned with the upper contacts.

* * * * *